United States Patent
Merckling et al.

(10) Patent No.: US 9,425,314 B2
(45) Date of Patent: Aug. 23, 2016

(54) PASSIVATED III-V OR GE FIN-SHAPED FIELD EFFECT TRANSISTOR

(71) Applicant: IMEC, Leuven (BE)

(72) Inventors: Clement Merckling, Leuven (BE); Matty Caymax, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/197,840

(22) Filed: Mar. 5, 2014

(65) Prior Publication Data

US 2014/0252414 A1    Sep. 11, 2014

(30) Foreign Application Priority Data

Mar. 5, 2013    (EP) ..................................... 13157812

(51) Int. Cl.
*H01L 29/66* (2006.01)
*H01L 29/78* (2006.01)
(Continued)

(52) U.S. Cl.
CPC .......... *H01L 29/785* (2013.01); *H01L 21/0254* (2013.01); *H01L 21/02532* (2013.01); *H01L 29/66795* (2013.01); *H01L 29/7851* (2013.01); *H01L 21/76224* (2013.01)

(58) Field of Classification Search
CPC ................ H01L 21/82343; H01L 21/823821; H01L 27/0886; H01L 27/0924; H01L 27/10826; H01L 27/10879; H01L 27/1211; H01L 29/41791; H01L 29/66795; H01L 29/7855; H01L 29/78645; H01L 29/785
USPC .................. 438/149, 197, 198; 257/192, 288, 257/E21.676, E21.692
See application file for complete search history.

(56) References Cited

U.S. PATENT DOCUMENTS 7,196,008 B1   3/2007 Shiraiwa et al.
7,317,230 B2   1/2008 Lee et al.
(Continued)

FOREIGN PATENT DOCUMENTS

JP      56112741        9/1981
WO   2008/039495 A1    4/2008
WO   2008/042732 A2    4/2008

OTHER PUBLICATIONS

Waldron, N. et al., "Integration of III-V on Si for High-Mobility CMOS", 2012 International Silicon-Germanium Technology and Device Meeting (ISTDM), Jun. 4-6, 2012, Berkeley, CA, pp. 1-2.
(Continued)

*Primary Examiner* — Brook Kebede
(74) *Attorney, Agent, or Firm* — McDonnell Boehnen Hulbert & Berghoff LLP

(57) ABSTRACT

A semiconductor device includes a semiconductor substrate having a top surface, and at least one coated fin protruding perpendicularly from the surface and having a height h and side walls. The at least one coated fin further includes a core of one or more layers selected from the group consisting of (a) III-V compound layers and (b) a Ge layer, and a coating overlaying the core. The coating includes one or more metal oxide layers, at least one of which is aluminium. The device also includes a recess surrounding the at least one coated fin and being defined between two coated fins when more than one fin is present. The recess is filled up with a dielectric material so as to cover the coating on the side walls of the at least one fin up to a certain height h', which is less than the height h. The present disclosure also relates to a method for producing the semiconductor device.

19 Claims, 2 Drawing Sheets

(51) Int. Cl.
*H01L 21/02* (2006.01)
*H01L 21/762* (2006.01)

(56) References Cited

U.S. PATENT DOCUMENTS

| | | |
|---|---|---|
| 2005/0199920 A1 | 9/2005 | Lee et al. |
| 2007/0134884 A1 | 6/2007 | Kim et al. |
| 2010/0015778 A1* | 1/2010 | Lin .................. H01L 21/76232 438/443 |
| 2010/0301390 A1 | 12/2010 | Ko et al. |
| 2011/0084355 A1 | 4/2011 | Lin et al. |
| 2011/0147798 A1 | 6/2011 | Radosavljevic et al. |
| 2013/0089958 A1* | 4/2013 | Yeh et al. ..................... 438/197 |
| 2014/0061820 A1* | 3/2014 | Reznicek et al. ............. 257/401 |

OTHER PUBLICATIONS

European Search Report, European Patent Application No. 13157812.2, dated Jul. 31, 2013.

\* cited by examiner

PASSIVATED III-V OR GE FIN-SHAPED FIELD EFFECT TRANSISTOR

CROSS-REFERENCE TO RELATED APPLICATION

This application claims priority to European Patent Application No. 13157812.2 filed on Mar. 5, 2013, the contents of which are hereby incorporated by reference.

TECHNICAL FIELD OF THE DISCLOSURE

The present disclosure relates to a semiconductor device, and more particularly to a III-V and/or Ge based Fin-shaped Field Effect Transistor (FinFET) and to a method for manufacturing the same.

BACKGROUND OF THE DISCLOSURE

Moore's law has dictated for decades scaling of Si-based CMOS technology in terms of performance, power consumption, area, and cost. As we have reached the physical limits of scaling Si channels, however, alternative materials with higher intrinsic carrier mobilities such as Ge and III-V compound semiconductors are needed. It is anticipated that highly performing III-V or Ge based devices will be used only in those circuits of a Central Processing Unit (CPU) or analog/Radio Frequency (RF) front end chips where high speed is required, while their more conservative Si counterparts will still be used for all non-core peripheral functions, such as for Input/Output (I/O).

Therefore, a scheme allowing co-integration of Ge and III-V together with Si channels is desired. For the heterogeneous integration of III-V or Ge on Si substrates, one of the likely schemes possible for integration is the use of the aspect-ratio-trapping (ART) technique. In this approach, the III-V or Ge layer is selectively grown in high aspect ratio trenches of the Shallow Trench Isolation (STI) type. Selective epitaxial growth (SEG) or Selective Area Growth (SAG) of Ge or III-V material in narrow trenches between $SiO_2$ isolation structures allows defects to be confined and trapped at the vertical interface between the growing epi-layer and the oxide. However, many issues remain in the manufacture of such Ge and III-V based devices. In particular, Ge or III-V based FinFET devices produced by ART have shown high levels of source to drain leakage (see N. Waldron et al., International SiGe Technology Device Meeting 2012, Berkeley). Also, the methods of manufacturing these devices are usually complicated and labour-intensive.

SUMMARY OF THE DISCLOSURE

The present disclosure provides III-V and/or Ge based semiconductor devices and, in particular, III-V and/or Ge FinFETs having low source to drain leakage. As discussed herein, the low leakage can be achieved by the disclosed devices due to the passivation action of a coating present along a sidewall of a fin at a dielectric/III-V (and/or Ge) interface. The disclosed devices can be provided via a simple CMOS compatible and scalable procedure.

In a first aspect, the present disclosure relates to a method for manufacturing a semiconductor device that includes the steps of providing a structure that has a semiconductor substrate, a layer of a first dielectric material overlaying the substrate and including at least one trench of depth h extending down to the substrate, and a filling. The filling includes one or more layers selected from the group consisting of III-V compound layers and a Ge layer. The filling fills-in the at least one trench and forms a fin of height h within each of the at least one trench, thereby providing at least one fin, which has side walls and a top surface. Further, the method includes removing the layer of the first dielectric material in order to provide at least one fin core structure having free side walls and a free top surface, and a recess exposing a substrate surface area around the at least one fin core structure. In addition, the method includes overlaying a coating onto the at least one fin core structure, thereby providing at least one coated fin having all side walls and the top surface coated with the coating. The coating includes one or more metal oxide layers, at least one of which is aluminium. The method also includes filling-in the recess so as to cover the exposed substrate surface area and the side walls of the at least one coated fin up to a certain height h', which is less than or lower than h, with a second dielectric material.

This example method is simple, CMOS compatible, and scalable. This method, due to the particular position of the coating, also can form a semiconductor device that can be part of a Fin Field Effect Transistor having low source to drain leakage.

As used herein and unless provided otherwise, the term "III-V compound" relates to a chemical compound with at least one group III (IUPAC group 13) element and at least one group V element (IUPAC group 15). This includes binary compounds but also higher order compounds such as ternary compounds.

In an embodiment, the layer of dielectric material overlaying the substrate may comprise $SiO_2$.

In an embodiment, the step of removing the layer of dielectric material may comprise wet etching the dielectric material with a HF-comprising solution.

In an embodiment, the step of overlaying may be performed by Atomic Layer Deposition. This can be beneficial because it facilitates a conformal coating (e.g., an $Al_2O_3$ layer) of very well controlled and uniform thickness.

In an embodiment, the method may further include a step of covering the top surface and the exposed sidewalls of the at least one fin with a gate electrode. This embodiment takes advantage of the coating (e.g., an $Al_2O_3$ layer) overlaying the top portion of the fin by using this layer as the dielectric of a gate stack.

In an embodiment, the step of overlaying a coating (e.g., an $Al_2O_3$ layer) onto the at least one fin core structure also includes overlaying the coating onto the substrate surface within the recess. Overlaying the coating on both the fin core structure and the recess(es) is generally easier than only covering the fin core structure as no masking steps are needed. Furthermore the presence of the resulting coating on the substrate surface with the recess can be beneficial because in this way any discontinuity or non-uniformity of the coating in the vicinity of the fin core structure is avoided.

In a second aspect, the present disclosure relates to a semiconductor device that includes a semiconductor substrate having a top surface and at least one coated fin protruding perpendicularly from the surface and having a height h and side walls. The at least one coated fin includes a core having one or more layers selected from the group consisting of III-V compound layers and a Ge layer, and a coating overlaying the core. The coating includes one or more metal oxide layers, at least one of which is aluminium. Further, the device includes a recess surrounding the at least one coated fin and being defined between two coated fins when more than one fin is present. The recess is filled up with a dielectric material so as to cover the coating on the side walls of the at least one fin up to a certain height h', which is less than or lower than the height h.

Such an improved semiconductor device can be used to form transistors having a low source-drain leakage current.

In an embodiment, the semiconductor device may be a Fin-shaped Field Effect Transistor. Such a FinFET shows a low source-drain leakeage current.

In an embodiment, the semiconductor substrate may have a silicon top surface.

In an embodiment, the silicon surface may have the Miller indices (001).

In an embodiment, a width of the fin may be from between 5 to 100 nm, preferably between 10 to 30 nm.

In an embodiment, the height h minus the height h' may be from between 30 nm to 120 nm, preferably between 40 nm to 100 nm.

In an embodiment, a length of the fin may be from between 50 to 200 nm, preferably from between 75 to 160 nm.

In an embodiment, a ratio between the height h minus the height h' (h-h') and the width of the fin may be from between 1 to 24, preferably from between 3 to 10.

In an embodiment, the III-V compound layers may be selected from InP layers and InGaAs layers.

In an embodiment, the core may include a Ge layer at the interface with the substrate top surface and a III-V compound layer making up the rest of the core.

In an embodiment, the coating overlying the core may be overlying the side walls and the top surface of the core, thereby providing a fin coated on the total height h;

In an embodiment, the coating includes one or more metal oxide layers, at least one of which is aluminium, and may have a thickness of from 1 to 10 nm. This thickness range can be beneficial by fulfilling the functions of (a) being thick enough for preventing leakage, e.g., between source and drain electrodes defined in the fin, and (b) being thick enough for serving as an efficient gate dielectric but thin enough to avoid excessive equivalent oxide thickness.

In an embodiment, the dielectric material may be $SiO_2$.

In an embodiment, the height h' may represent from between 65 to 90% of the height h.

In an embodiment, the device may further include a gate electrode covering the top surface and the exposed sidewalls of the at least one fin. This embodiment takes advantage of the coating overlaying the top portion of the fin by using this layer as the dielectric of a gate stack.

In an embodiment, the coating may be conformally overlay the substrate and may have a thickness uniformity characterized by a relative standard deviation of less than 7%, preferably less than 5%, more preferably less than 3%, yet more preferably less than 1%.

In an embodiment, the coating may be made of a single piece.

In an embodiment, the at least one fin may have a drain region and a source region.

In any embodiments of the first or second aspects of the present disclosure, at least one of the one or more metal oxide layers may be a binary aluminium oxide (AlOx) or a ternary metal-aluminium oxide (MAlOx). Amongst these oxides, high-k dielectrics are can be used. Examples of binary aluminium oxides are $Al_2O_3$ and non-stoichiometric $AlO_x$. Examples of ternary metal-aluminium oxides are $HfAlO_x$ and $ZrAlO_x$.

In an embodiment, at least one of the one or more metal oxide layers may be an $Al_2O_3$ layer. For instance, the coating may comprise two layers, one $Al_2O_3$ layer and one $HfO_2$ layer.

In any embodiments of the first or second aspect, when the coating includes more than one layer, the layer adjacent to and in contact with the core structure of the fin may be preferably an aluminium-comprising layer. This can be beneficial because the Al-comprising metal oxide layer has a passivating effect for the III-V substrate.

In an embodiment, the coating may be a single aluminium-comprising metal oxide layer, for instance an $Al_2O_3$ layer.

Particular and preferred aspects of the disclosure are set out in the accompanying independent and dependent claims. Features from the dependent claims may be combined with features of the independent claims and with features of other dependent claims as appropriate and not merely as explicitly set out in the claims as filed.

Although there has been constant improvement, change and evolution of devices in this field, the present concepts are believed to represent substantial new and novel improvements, including departures from prior practices, resulting in the provision of more efficient, stable, and reliable devices of this nature.

The above and other characteristics, features, benefits, and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

DESCRIPTION OF ILLUSTRATIVE EMBODIMENTS

Figure 1:
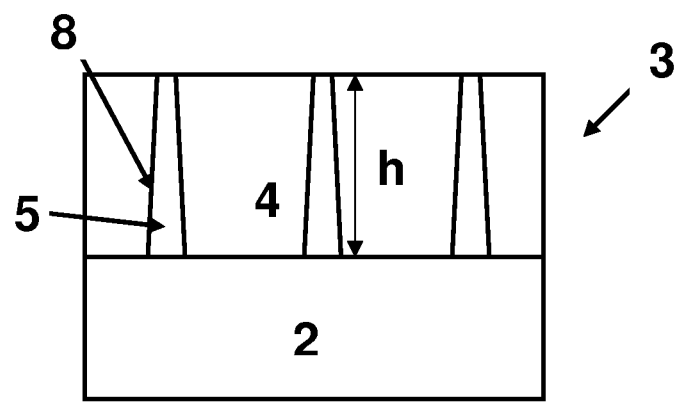
FIGS. 1 to 4 represent schematically four steps of a method according to an embodiment of the present disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third, and the like in the description and in the claims, are used for distinguishing between elements, which can be the same, similar, or distinct, and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps, or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B. Likewise, the terms "including," "having," and the like are used in the same non-limiting and non-exclusive fashion.

Reference throughout this specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Reference will be made to transistors. Generally, these are three-terminal devices having a first main electrode such as a drain, a second main electrode such as a source, and a control electrode such as a gate for controlling the flow of electrical charges between the first and second main electrodes.

It will be clear for a person skilled in the art that the present disclosure is also applicable to similar devices that can be configured in any transistor technology, including for example, but not limited thereto, CMOS, BICMOS, Bipolar, and SiGe BICMOS technologies.

FIG. 1 shows a schematic representation of cross-section of a structure 3 as provided in a first step of a method for manufacturing a semiconductor device according to an embodiment of the second aspect of the present disclosure. In this first step, the structure 3 includes a semiconductor substrate 2, a layer of dielectric material 4 overlaying the substrate 2 and including at least one trench 8 of depth or height h extending down to the substrate 2. The structure 3 also includes a filling 5 that includes one or more layers selected from the group consisting of (a) III-V compound layers and (b) a Ge layer. The filling 5 fills-in the at least one trench 8 and forms a fin 5 of height h within each of the at least one trench 8, thereby providing at least one fin 5 that has side walls and a top surface.

The semiconductor substrate 2 can typically be a Si substrate having a (001) Miller index top surface. The layer of dielectric material 4 overlaying the substrate 2 and including at least one trench 8 can be obtained by the so called STI process. This process is well known to the person skilled in the art and for conciseness of the present disclosure does not need to be described in detail here. In a nutshell, the STI process typically starts with thermal growing of an oxide on top of the substrate 2. This is typically followed by a Low-Pressure Chemical Vapor Deposition (LP CVD) of a silicon nitride layer. Next, the areas under which it is desired to produce the trenches 8, which will ultimately be filled in with III-V and/or Ge material to form the fins 5, are masked with a resist, and a dry etch step is applied to create trenches (not yet the trenches 8 that will serve as a mold for the fins 5). After removing the resist, a thick silicon oxide High-Density Plasma (HDP) is deposited. HDP is capable of filling the high aspect ratio of the trenches. Then, a chemical mechanical planarization (CMP) step is performed. Next, the nitride masking layer is removed, using a wet etch. The Si in between the STI oxide can then be thermally etched by means of HCl vapour, thereby providing the at least one trench 8 of depth h extending down to the substrate 2.

As an example, the at least one trench 8 can be filled as follow. First, a Ge seed layer is deposited in the bottom of the trench by CVD selective area epitaxy of Ge; second, InP is overgrown to a level above the level of the trench 8; third, the surface is planarized via a CMP step, thereby providing the structure 3.

Figure 2:
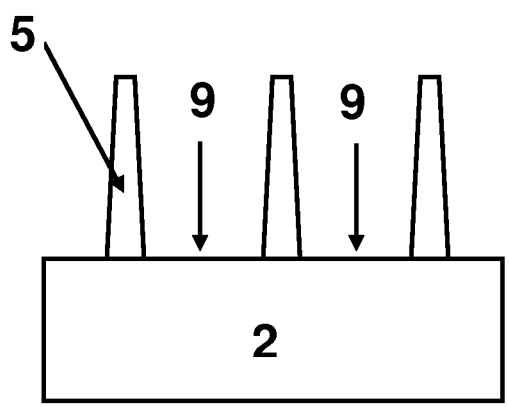

The result of a second step of the method is illustrated in FIG. 2 wherein the dielectric layer (e.g., HDP) is removed in order to provide at least one fin core structure 5 having free side walls and a free top surface, and a recess 9 exposing a substrate 2 surface area around the at least one fin core structure 5.

In the case of a $SiO_2$ dielectric layer, its removal can be performed by etching (wet or dry). For instance, a dipping in a $HF_{aq}$ solution can be performed.

Figure 3:
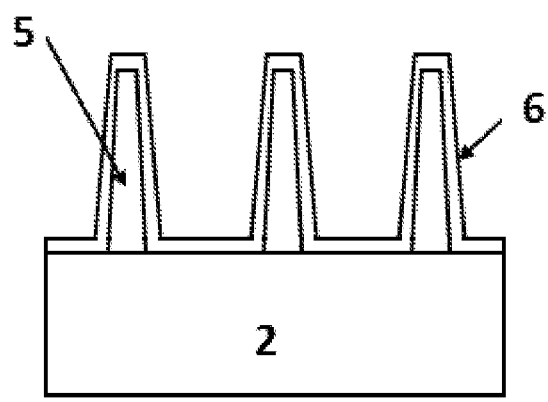

The result of a third step is shown in FIG. 3 wherein an $Al_2O_3$ layer 6 is overlaid by ALD onto the at least one fin core structure 5, thereby providing at least one coated fin 5 having all side walls and the top surface coated with the $Al_2O_3$ layer 6.

Figure 4:
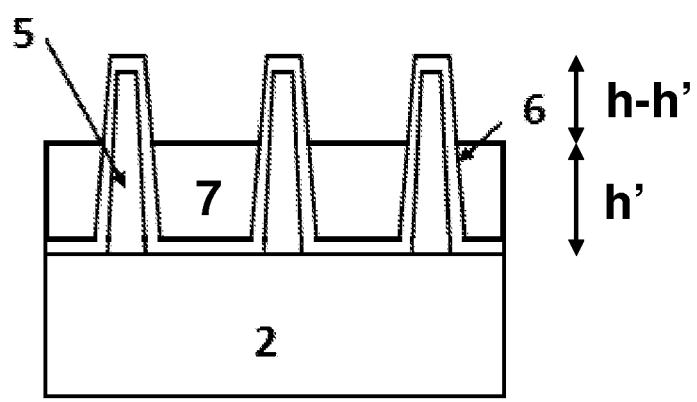

The result of a fourth step is shown in FIG. 4, wherein the exposed substrate surface area and the side walls of the at least one coated fin 5 are covered up to a certain height h', which is less than or lower than the height h, with a dielectric material 7 via an STI process.

It is to be understood that although preferred embodiments, specific constructions and configurations, as well as materials, have been discussed herein for devices according to the present disclosure, various changes or modifications in form and detail may be made. For example, steps may be added or deleted to methods described within the scope of the present disclosure.

The invention claimed is:

1. A method for manufacturing a semiconductor device, comprising the steps of:
   providing a structure having:
      a semiconductor substrate,
      a layer of a first dielectric material overlaying the substrate and defining at least one trench of depth h extending down to the substrate, and
      a filling including one or more layers selected from the group consisting of III-V compound layers and a Ge layer, the filling disposed in the at least one trench and forming a fin of height h within each of the at least one trench, thereby providing at least one fin, the at least one fin having side walls and a top surface;
   removing the layer of the first dielectric material in order to define at least one fin core structure having free side walls and a free top surface, and a recess exposing a substrate surface area around the at least one fin core structure;
   overlaying a coating onto the at least one fin core structure, thereby providing at least one coated fin having all side walls and the top surface coated with the coating, wherein the coating includes one or more metal oxide layers, at least one of which is aluminium; and
   filling in the recess so as to cover the exposed substrate surface area and the side walls of the at least one coated fin up to a certain height h', which is less than the height h, with a second dielectric material.

2. The method of claim 1, wherein the layer of the first dielectric material overlaying the substrate includes $SiO_2$.

3. The method of claim 1, wherein overlaying the coating is performed conformally by Atomic Layer Deposition.

4. The method of claim 1, wherein overlaying the coating includes overlaying the coating onto the exposed substrate surface area.

5. A semiconductor device comprising:
   a semiconductor substrate having a top surface;
   at least one coated fin protruding perpendicularly from the top surface and having a height h and side walls, wherein the at least one coated fin includes:
      a core that has one or more layers selected from the group consisting of III-V compound layers and a Ge layer, and
      a coating made of a single piece overlaying the core, wherein the coating includes one or more metal oxide layers, at least one of which is aluminium; and
   a recess surrounding the at least one coated fin and being defined between two coated fins when more than one fin is present, wherein the recess is filled up with a dielectric material so as to cover the coating on the side walls of the at least one fin up to a height h' that is lower than the height h.

6. The device of claim 5, wherein the semiconductor device is a Fin-shaped Field Effect Transistor.

7. The device of claim 5, wherein a ratio between the height h minus the height h' and the width of the fin is from between 1 to 24.

8. The device of claim 7, wherein the ratio between the height h minus the height h' and the width of the fin is from between 3 to 10.

9. The device of claim 5, wherein the III-V compound layers are selected from InP layers and InGaAs layers.

10. The device of claim 5, wherein the core includes a Ge layer at an interface with the substrate top surface and a III-V compound layer of the core.

11. The device of claim 5, wherein the coating has a thickness of from 1 to 10 nm.

12. The device of claim 5, wherein the dielectric material is $SiO_2$.

13. The device of claim 5, wherein the height h' is from between 75% to 95% of the height h.

14. The device of claim 5, wherein the coating conformally overlays the substrate and has a thickness uniformity characterized by a relative standard deviation of less than 7%.

15. The device of claim 14, wherein the relative standard deviation is less than 5%.

16. The device of claim 5, wherein the coating has a uniform composition.

17. The device of claim 5, wherein the coating is an $Al_2O_3$ layer.

18. The device of claim 5, wherein the coating overlays on the semiconductor substrate within the recess.

19. The device of claim 5, wherein the recess extends to the semiconductor substrate.

* * * * *